United States Patent
Ouyang et al.

(10) Patent No.: US 6,927,414 B2
(45) Date of Patent: Aug. 9, 2005

(54) HIGH SPEED LATERAL HETEROJUNCTION MISFETS REALIZED BY 2-DIMENSIONAL BANDGAP ENGINEERING AND METHODS THEREOF

(75) Inventors: Qiqing Christine Ouyang, Yorktown Heights, NY (US); Jack Oon Chu, Manhasset Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/462,933

(22) Filed: Jun. 17, 2003

(65) Prior Publication Data

US 2004/0256614 A1 Dec. 23, 2004

(51) Int. Cl.[7] .............................................. H01L 21/36
(52) U.S. Cl. ........................... 257/20; 257/19; 257/190; 257/194; 438/172; 438/933
(58) Field of Search ..................... 257/18–20, 190–192, 257/194, 205, E21.403, E21.618, E27.061, E29.248; 438/172, 275, 282, 933

(56) References Cited

U.S. PATENT DOCUMENTS

| | | | |
|---|---|---|---|
| 6,524,935 B1 * | 2/2003 | Canaperi et al. | 438/478 |
| 2004/0065927 A1 * | 4/2004 | Bhattacharyya | 257/369 |

OTHER PUBLICATIONS

Huang, L.J. et al., "Carrier Mobility Enhancement in Strained Si–on–Insulator Fabricated by Wafer Bonding," 2001 Sympos. on VLSI Tech. Digest of Technical Papers, pp. 57–58.*

Feder, B.J., "I.B.M. Finds Way to Speed Up Chips," The New York Times, Jun. 8, 2001.*

Nayfeh, H.M. et al., "Electron Inversion Layer Mobility in Strained–Si n–MOSFET'S with High Channel Doping Concentration Achieved by Ion Implantation," DRC Conf. Digest, 2002, pp. 43–44.*

"Modern Dictionary of Electronics" (Rudolf F. Graf, ed.), 1999, Butterworth–Heinemann division of Reed–Elsevier Group, p. 345.*

* cited by examiner

Primary Examiner—Minhloan Tran
Assistant Examiner—Thomas L. Dickey
(74) Attorney, Agent, or Firm—Scully, Scott, Murphy & Presser; Robert M. Trepp, Esq.

(57) ABSTRACT

A method for forming and the structure of a strained lateral channel of a field effect transistor, a field effect transistor and CMOS circuitry is described incorporating a drain, body and source region on a single crystal semiconductor substrate wherein a hetero-junction is formed between the source and body of the transistor, wherein the source region and channel are independently lattice strained with respect the body region. The invention reduces the problem of leakage current from the source region via the hetero-junction and lattice strain while independently permitting lattice strain in the channel region for increased mobility via choice of the semiconductor materials and alloy composition.

23 Claims, 7 Drawing Sheets

HIGH SPEED LATERAL HETEROJUNCTION MISFETS REALIZED BY 2-DIMENSIONAL BANDGAP ENGINEERING AND METHODS THEREOF

RELATED APPLICATIONS

This application is cross referenced to U.S. patent application Ser. No. 10/463,039 by Q. Ouyang and Jack O. Chu, the inventors herein, filed herewith, entitled "Low Leakage Heterojunction Vertical Transistors and High Performance Devices Thereof" which is directed to a vertical p-channel MOSFET which is incorporated herein by reference and assigned to the assignee herein.

This application is further cross referenced to U.S. patent application Ser. No. 10/463,038 by Q. Ouyang and Jack O. Chu, the inventors herein, filed herewith, entitled "Ultra Scalable High Speed Heterojunction Vertical n-channel MISFETs and Methods Thereof" which is directed to vertical n-channel MISFETs which is incorporated herein by reference and assigned to the assignee herein.

FIELD OF THE INVENTION

This invention relates to semiconductor transistors and, more particularly, to a metal insulator semiconductor field effect transistor (MISFET) consisting of a conducting channel which has no hetero-barrier in the current flow direction and a heterojunction between the source/drain and body (bulk) of the transistor.

BACKGROUND OF THE INVENTION

Silicon MOSFET scaling has become a major challenge in the semiconductor industry. Traditional techniques start to fail in reducing certain undesirable physical effects as device dimensions shrink down to the nanometer regime. For example, anti-punchthrough (APT) or halo implantation is used to reduce the short-channel effects (SCE). However, the abrupt doping profiles are difficult to achieve due to temperature enhanced diffusion, and these highly doped channels or pocket implant regions increase junction capacitance and band-to-band tunneling. It has been shown by S. Thompson, et al., in "MOS scaling: transistor challenges for the 21st century," Intel Technology Journal, Q3, 1998, that channel engineering can only decrease the circuit gate delay by ~10% for a given technology, and it cannot provide channel length scaling for generation after generation that gate oxide and source/drain (S/D) junction depth scaling has provided.

With bandgap engineering, an important degree of freedom can be provided in the device design. The growth of high-quality tensile strained Si/SiGe and compressively strained SiGe/Si heterostructures by molecular beam epitaxy (MBE), various types of chemical vapor deposition (CVD), and/or ion implantation allows incorporation of bandgap engineering concepts into a mature silicon technology.

Bandgap engineering has been utilized to realize various types of heterojunction field effect transistors (HFETs). The most widely studied is the modulation doped field effect transistors (MODFETs), in which a quantum well is used to confine the carriers in a lightly doped semiconductor (See K. Ismail, "Si/SiGe High-Speed Field-Effect Transistors", IEDM, Tech. Dig., p. 509–512, 1995). Higher carrier mobility can be achieved due to reduced impurity scattering, reduced surface roughness scattering in the buried channel, and strained-induced mobility enhancement, if any, depending on the hetero material system employed. Derived from the same concept, various types of heterostructure CMOS devices have also been proposed and studied (See M. A. Armstong, et al., "Design of Si/SiGe Heterojunction Complementary Metal-Oxide Semiconductor Transistors", IEDM Tech. Dig., p. 761–764, 1995; S. Imai et al., "Si—SiGe Semiconductor Device and Method of Fabricating the Same", U.S. Pat. No. 5,847,419; and M. Kubo, et al., "Method of Forming HCMOS Devices with a Silicon-Germanium-Carbon compound Semiconductor Layer", U.S. Pat. No. 6,190,975, Feb. 20, 2001.) The advantage of these devices is the higher carrier mobility and hence high drive current and high speed. However, two prominent problems remain in these planar devices: device scaling and control of short-channel effects.

As for short-channel effects, other than ultra-steep retrograded channel profiles and ultra-shallow source/drain junctions, silicon-on-insulator (SOI) has been used to control short-channel effects. However, SOI alone cannot remove the short-channel effects completely, and moreover, an inherent problem with SOI is the floating body effect. Another way to reduce the short-channel effect is to have a built-in energy barrier at the source/body junction, and in particular a barrier where the barrier height does not depend on the applied bias. The band offset provided by a heterojunction is very suitable in this case. A heterojunction MOSFET (HJMOSFET) was been proposed and studied by S. Hareland, et al., in "New structural approach for reducing punchthrough current in deep submicrometer MOSFETs and extending MOSFET scaling," IEEE Electronics Letters, vol. 29, no. 21, pp. 1894–1896, October 1993, and by X. D. Chen, et al., in "Vertical P-MOSFETS with heterojunction between source/drain and channel," Device Research Conference, Denver, June 2000.

Recently, a lateral, high mobility, p-channel heterojunction transistor (HMHJT) has been proposed by Q. Ouyang, et al., in U.S. Pat. No. 6,319,799. A detailed simulation study has been performed by Q. Ouyang, et al., in "A Novel Si/SiGe Heterojunction pMOSFET with Reduced Short-Channel Effects and Enhanced Drive Current," IEEE Transactions on Electron Devices, 47 (10), 2000. In order to achieve complementary MISFETs using such a pMISFET, a comparable high performance nMISFET is needed. In the present invention, a lateral, high performance, heterojunction nMISFET is proposed and two embodiments are illustrated. Two embodiments for the complementary MOSFET are presented. The methods thereof are also described.

U.S. Pat. No. 5,285,088 describes a "High Electron Mobility Transistor". This device has a pair of semiconductor layers for source/drain electrodes consisting of a poly SiGe layer and a poly Si layer so as to form a partially projected "overhanging-shape" over the active area. In this case, the source/drain and the gate are self-aligned. However, it is a planar structure and still suffers from the short-channel effects.

SUMMARY OF THE INVENTION

The objective of this invention is to provide a device structure that has superb performance and scalability. By using 2-dimensional bandgap engineering, the tradeoffs in the conventional Si technology can be avoided, and the drive current and leakage current can be optimized independently. Consequently, very high drive current and excellent turn-off characteristics can be achieved simultaneously. Moreover, the suppression of short-channel effects in such a device further allows continuous and more aggressive scaling of the MOSFET technology.

This invention describes a lateral n-channel and complementary MISFET structure having these advantages with various embodiments. Another aspect of this invention is the process integration scheme for such devices. The devices described in this invention have at least a hetero-barrier between the source and the body of the transistor, however, there is no hetero-barrier in the channel along the current flow direction. Drain induced barrier lowering is substantially reduced due to the hetero-barrier at the source junction, hence, the subthreshold swing and off-state leakage are reduced. Meanwhile, the drive current is not limited by quantum mechanical tunneling since there is no hetero-barrier in the channel. Therefore, with these devices, very high on/off ratio can be achieved. Such devices are superb in high speed, low leakage and low power applications, such as DRAM, laptop computers, and wireless communications.

Any hetero-material system with the proper band offset may be used to realize the device concept such as silicon-based or III-V material systems. Since silicon technology is the most mature, silicon based materials are the most economically feasible and attractive. There are two types of Si-based heterostructures which have the suitable band offset for electrons in nMISFETs. One is tensile strained Si or SiGe on relaxed SiGe buffer layers, and the other is tensile strained $Si_{1-x-y}Ge_xC_y$ on Si. On the other hand, in order to form complementary MISFETs, compressively strained SiGe or SiGeC on silicon can be used for pMISFETs, because it has the suitable band offset for holes. With each material system, the channel could be a surface channel or a buried quantum well channel, and the device can be built on various substrates such as bulk silicon, silicon-on-insulator, SiGe-on-insulator or silicon-on-sapphire substrate.

In the present invention, three embodiments for a lateral n-channel transistor are illustrated. Then two embodiments for a lateral CMOS are further described. The fabrication methods are also described.

BRIEF DESCRIPTION OF THE DRAWING

These and other features, objects, and advantages of the present invention will become apparent upon consideration of the following detailed description of the invention when read in conjunction with the drawing in which.

DETAILED DESCRIPTION OF THE PREFERRED EMBODIMENTS

Figure 1:
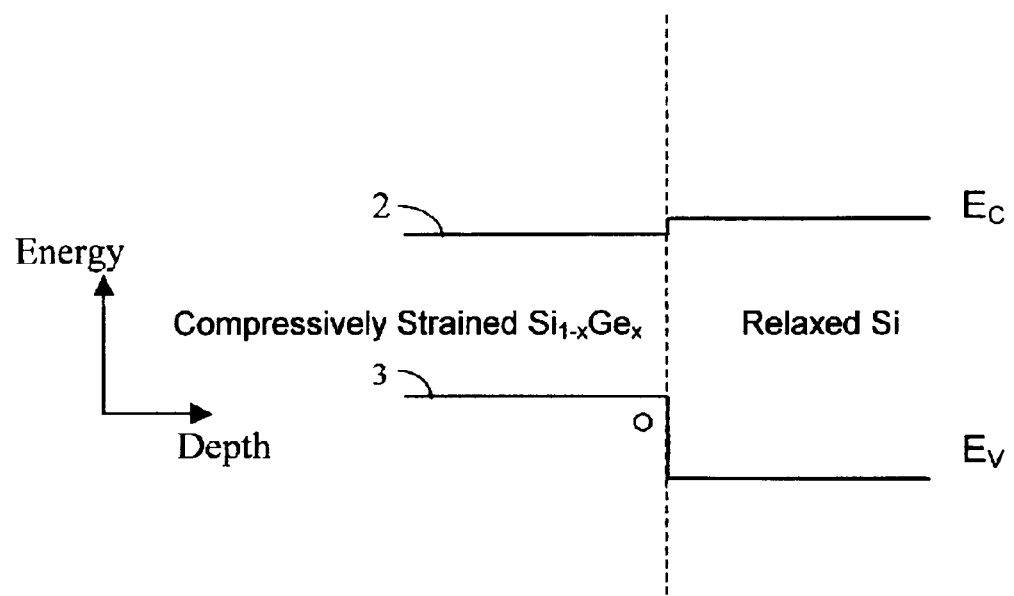
FIG. 1 is an energy band diagram of compressively strained SiGe or SiGe(C) on cubic Si.

The lattice spacing of carbon, silicon and germanium are 3.567 Å, 5.431 Å and 5.646 Å, respectively. Biaxial tensile strain exists in pseudomorphic SiC on relaxed Si, or in pseudomorphic Si on relaxed SiGe or Ge substrate. Biaxial tensile strain means a larger lattice spacing in the growth plane (surface) and a smaller lattice spacing in the growth direction (normal to the surface) in the pseudomorphic material. On the other hand, compressive biaxial strain exists in pseudomorphic SiGe on relaxed Si, in pseudomorphic SiGeC on relaxed Si, or in pseudomorphic Ge on relaxed SiGe. Compressive biaxial strain means a smaller lattice spacing in the growth plane (surface) and a larger lattice spacing in the growth direction (normal to the surface) in the pseudomorphic material. Adding a small amount of carbon (<1%) into compressively strained SiGe on relaxed Si can compensate and reduce the strain in SiGe. Strain changes the band structure of the strained material. Therefore, strain may affect the energy band offset, effective mass and density of states. Referring to the drawing, FIG. 1 shows the conduction band and valence band of compressively strained SiGe(C) on silicon by curves 2 and 3, respectively. Holes are confined in the compressively strained SiGe(C) which has high hole mobility, and this material system is suitable for pMOSFETs.

Figure 2:
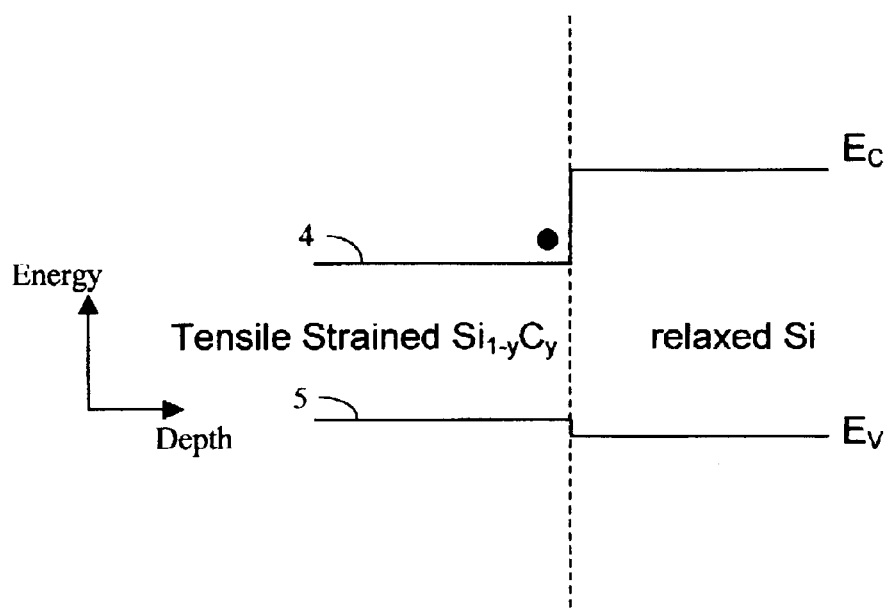
FIG. 2 is an energy band diagram of tensile strained SiC on cubic Si.
Figure 3:
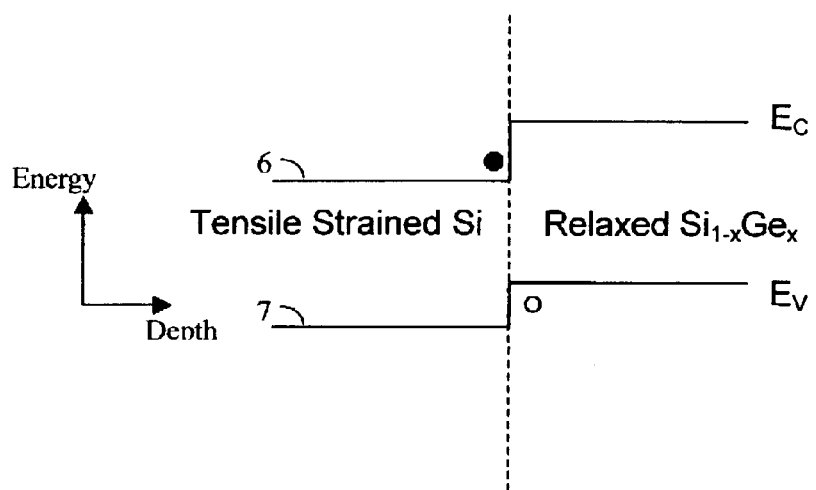
FIG. 3 is an energy band diagram of tensile strained Si on relaxed SiGe buffer.

FIG. 2 shows the conduction band and valence band of tensile strained $Si_{1-y}C_y$ on relaxed Si buffer layer by curves 4 and 5, respectively. In this case, electrons are confined in the tensile strained $Si_{1-y}C_y$ which potentially has high electron mobility, and this material system is suitable for nMOSFETs. Furthermore, FIG. 3 shows the conduction band and valence band of tensile strained silicon on relaxed silicon germanium by curves 6 and 7, respectively. Electrons are confined in the tensile strained silicon which has high electron mobility, and this material system is suitable for nMOSFETs. With the three material systems, the channel could either be a surface channel or a buried quantum well channel. In FIGS. 1–3, the ordinate represents energy and the abscissa represents depth.

Figure 4:
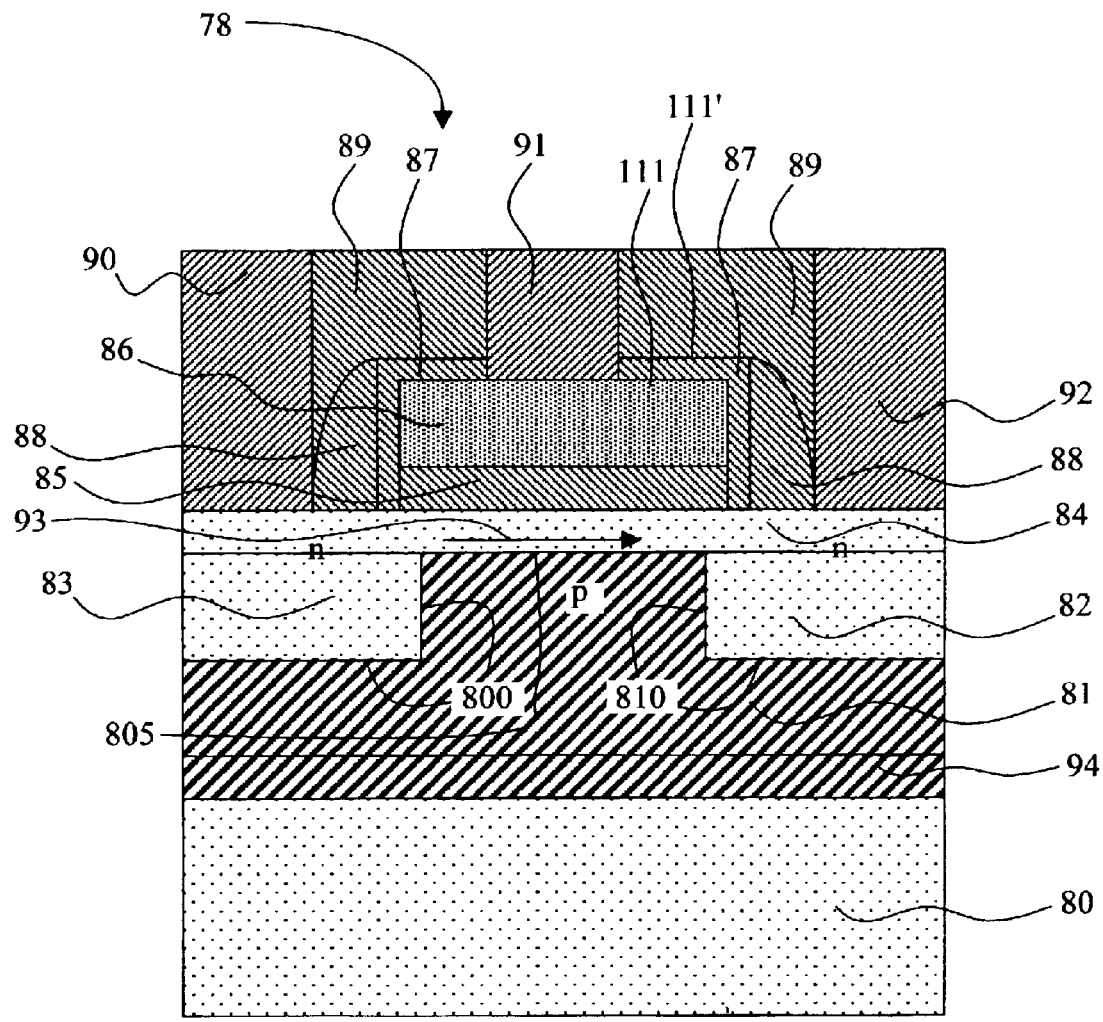
FIG. 4 is a cross sectional schematic of a lateral tensile strained Si surface channel nMOSFET according to the first embodiment of the present invention.

The cross sectional schematic for the first embodiment of a SiGe based lateral nMOSFET 78 is shown in FIG. 4. The device has the following structural characteristics:

1) The drain is n+-type tensile strained silicon 82;
2) The body is p-type relaxed SiGe 81, and the doping level is adjusted to achieve desirable the threshold voltage;
3) The source is n+-type tensile strained silicon 83;
4) The channel is tensile strained Si 84, and there is no hetero-barrier along the current flow direction shown by arrow 93. The channel forms a heterojunction with the body 81 at the interface 805 which functions to provide a band offset as shown in FIG. 3 to confine electrons in the Si channel 84. The channel is typically autodoped by the layer below. Thus the channel region over the body 81 is autodped p-type, while the channel region over the source 83 and drain 82 are doped n-type. There are other ways to provide the desired doping in the channel layer and source/drain.
5) A strained Si/SiGe heterojunction is formed between the source and the body at the interface 800, and preferably, aligned with the source/body metallurgical p/n junction. The heterojunction functions to block electrons from entering body 81, hence can reduce the off-state current by orders of magnitude. Futhermore, the higher the strain in the heterojunction, the higher the energy barrier becomes and in which case the leakage current from source to body then to drain can even be further reduced when the device is turned off.
6) A strained Si/SiGe heterojunction is formed between the drain and the body at the interface 810, and preferably, aligned with the drain/body metallurgical p/n junction;

7) The gate is a conducting layer 86 overlapping the entire strained silicon channel 84 and part of the source 83 and drain 82 with an insulator 85 in between;
8) The source, gate and drain electrodes 90, 91, 92 are coupled to the source 83, gate 86, and drain 82, respectively;
9) The device isolation is provided by an insulator layer 89;
10) Buffer layer 94 provides a relaxed SiGe lattice template for layer 81. Layer 80 may be bulk silicon, SOI substrate, bulk Ge, Ge-on-insulator, SiGe-on-insulator or silicon-on-sapphire.
11) Insulator layer 87 protects the gate stack 85 and 86.
12) Insulator layer 88 may be combined with layer 89 as one.

Figure 5:
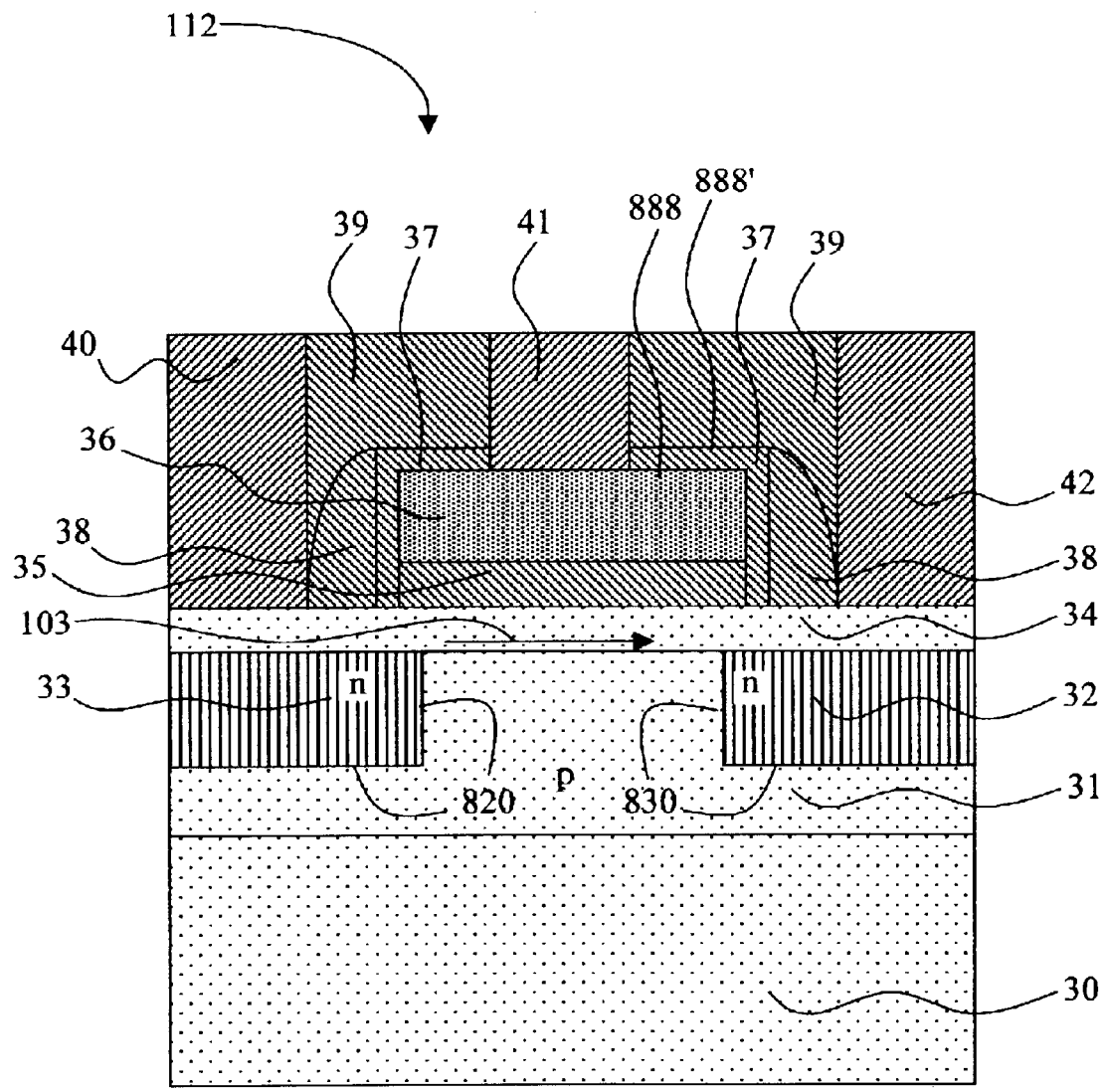
FIG. 5 is a cross sectional schematic of a lateral surface channel nMOSFET having tensile strained SiC in the source/drain regions according to a second embodiment of the present invention.

Besides using a relaxed SiGe as the virtual substrate to generate a tensile strained Si layer, tensile strained SiC on silicon can also be used for nMOSFET. The cross sectional schematic for the second embodiment of such a silicon-based lateral nMOSFET 112 is shown in FIG. 5. The device has the following structural characteristics:

1) The drain is n$^+$-type tensile strained SiC 32;
2) The body is p-type silicon 31, and the doping level is adjusted to achieve the desirable threshold voltage;
3) The source is n$^+$-type tensile strained SiC 33;
4) The channel is silicon or tensile strained SiC 34, and there is no hetero-barrier along the current flow direction;
5) A strained SiC/Si heterojunction is formed between the source and the body at the interface 820, and is preferably, aligned with the source/body metallurgical p/n junction;
6) A strained SiC/Si heterojunction is formed between the drain and the body at the interface 830, and is preferably, aligned with the drain/body metallurgical p/n junction;
7) The gate is a conducting layer 36 overlapping the entire channel 34 and part of the source 33 and drain 32 with an insulator 35 in between;
8) The source, gate and drain electrodes 40, 41 and 42 are coupled to the source 33, gate 36, and drain 32, respectively;
9) The device isolation is an insulator layer 39.
10) Layer 30 may be bulk silicon or a SOI substrate.
11) Insulator layer 37 protects the gate stack 35 and 36.
12) Insulator layer 38 may be combined with layer 39 as one.

Figure 6:
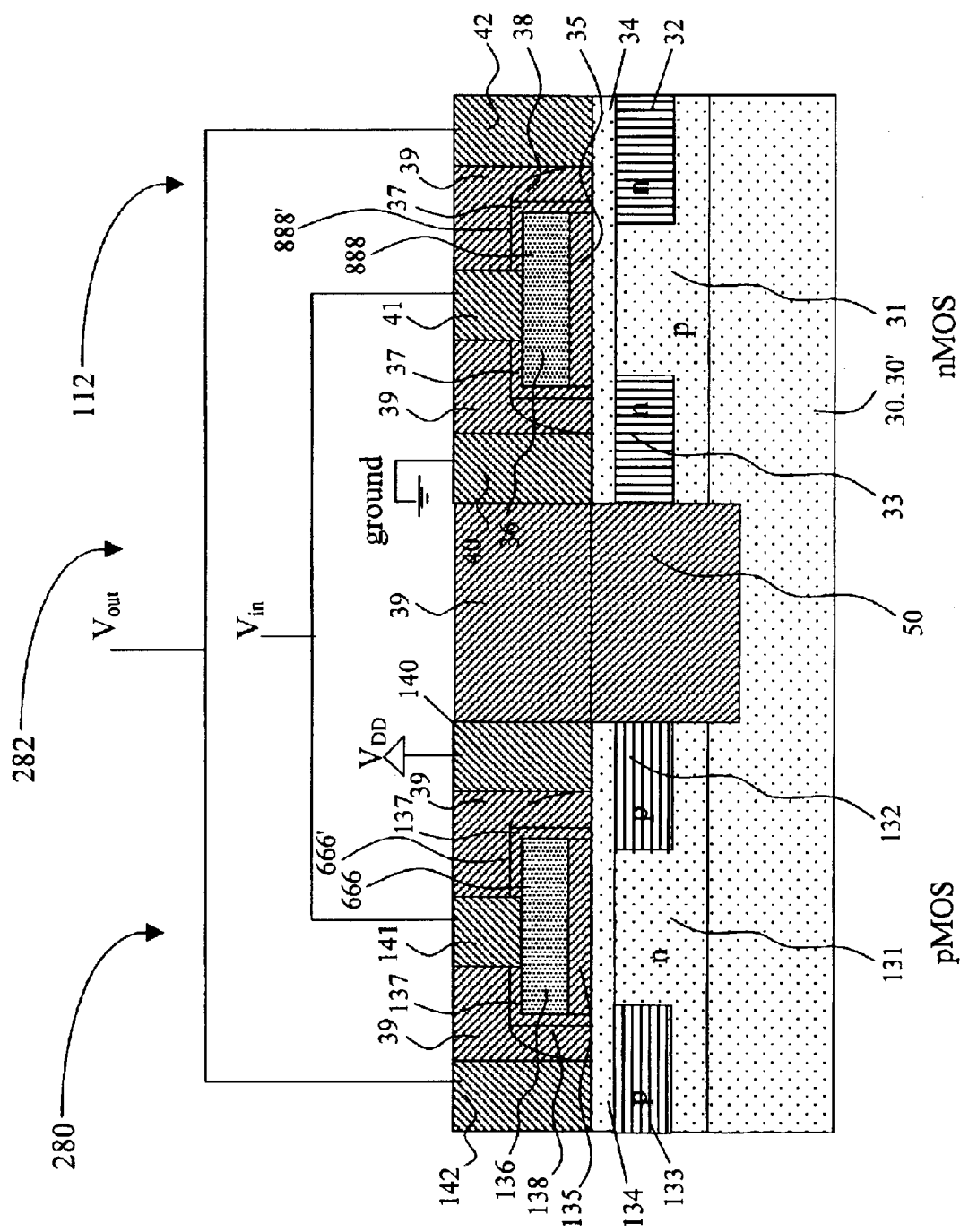
FIG. 6 is a cross sectional schematic of a lateral CMOS with tensile strained SiC source/drain for the nMOSFET and compressively strained $Si_{1-x-y}Ge_xC_y$ source/drain for pMOSFET.

FIG. 6 shows an embodiment of a lateral CMOS inverter 282, which is a combination of a lateral symmetric nMOSFET 112 and a lateral symmetric pMOSFET 280. The device isolation is provided by insulator regions 39 and 50. The nMOSFET 112 has a tensile strained SiC source/drain 32, 33 and a silicon or strained SiC channel 34; whereas the pMOSFET 280 has a compressively strained SiGeC source/drain 132, 133 and a silicon or strained SiGeC channel 134. The gate insulator 35 and 135 can be oxide, oxynitride, other high-permittivity dielectrics, or a combination thereof. The gate electrode 36, 136 can be the same kind of metal with a mid-gap work function, or a n-type poly silicon or poly SiGe for nMOSFET and p-type poly silicon or poly SiGe for pMOS, respectively.

Figure 7:
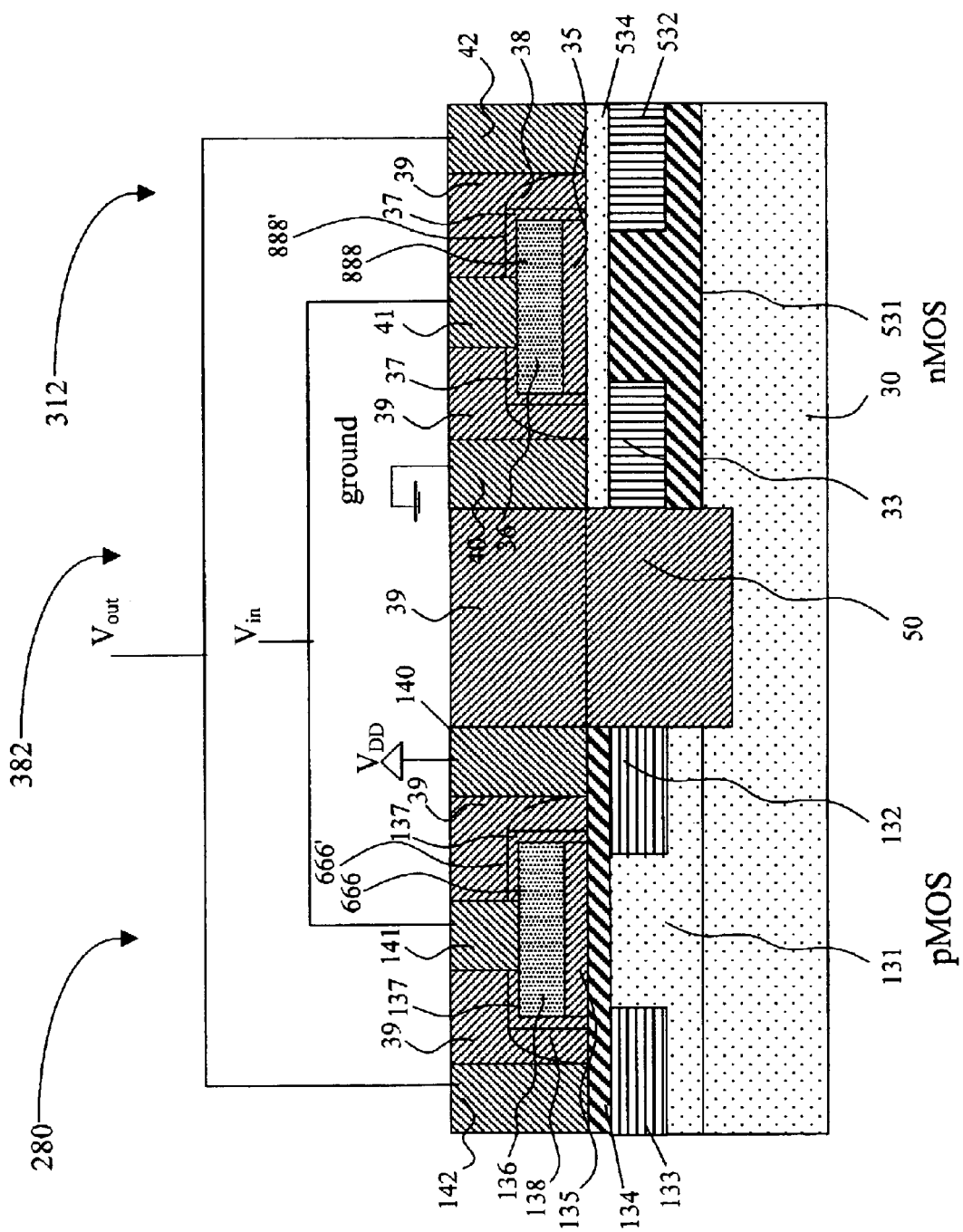
FIG. 7 is a cross sectional schematic of a lateral CMOS with tensile strained $Si_{1-y}C_y$ source/drain for the nMOSFET and compressively strained $Si_{1-x-y}Ge_xC_y$ source/drain for pMOSFET.

FIG. 7 shows a second embodiment for a lateral CMOS inverter 382, which is the same as FIG. 6 except for the nMOSFET 312. In this case, the nMOSFET 312 utilizes a tensile strained silicon source/drain 532, 533 and a tensile strained silicon channel 534. The gate insulator 35 and 135 can be oxide, oxynitride, other high-permittivity dielectrics, or a combination thereof. The gate electrode 36, 136 can be the same kind of metal with a mid-gap work function, or a n-type poly silicon or poly SiGe for nMOS and p-type poly silicon or poly SiGe for pMOS, respectively.

According to the preferred embodiment, this invention further comprises the scheme for process integration for a lateral heterojunction nMISFET:

a) Define a active region and form a well within on silicon, relaxed SiGe bulk, SOI, SGOI or GOI substrate;
b) Further define and form a gate region with a stack of dielectrics as a mask preferrably for selective processing;
c) Etch openings to form the recessed source and drain, which are self-aligned to said gate stack;
d) Preferably, do a selective epitaxial growth to form the tensile or compressively strained source/drain regions with or without in-situ doping;
e) Removal of said gate stack and planazation if necessary;
f) Epitaxial growth of the channel layer, plus the cap layer if desired for a buried channel device in an uniform manner over the well region and the source/drain regions;
g) Growth or deposition of a gate insulator layer, which may be an oxide, oxinitride, other high-permittivity dielectrics, singly or a combination thereof;
h) Growth or deposition of a gate electrode layer; which may be poly silicon, poly SiGe or metal;
i) Gate patterning and formation;
j) Ion implanting and annealing if the source, drain are not in-situ doped;
k) Deposition of field oxide;
l) Opening for contacts;
m) Source/drain and gate silicidation;
n) Metallization and metal sintering.

It should be noted that in the drawing like elements or components are referred to by like and corresponding reference numerals.

While there has been described and illustrated a lateral semiconductor device containing a high mobility channel and a heterojunction which preferably coincides with the junction of source and/or drain, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method of preparing a lateral strained silicon channel for a field effect transistor comprising:

providing a substrate having a body comprising a relaxed p-type $Si_{1-z}Ge_z$ epitaxial region;

forming spaced apart source/drain regions comprising strained n-type silicon regions within an upper portion of said relaxed p-type $Si_{1-z}Ge_z$ region, said strained n-type silicon regions having a dopant concentration of greater than $1\times10^{19}$ atoms/cm$^3$ and providing a vertical and lateral heterojunction between the source/drain regions and the body whereby said vertical heterojunction is contained entirely in said body, and forming a strained silicon region over said relaxed p-type $Si_{1-z}Ge_z$ region which is situated between said strained n-type silicon regions.

2. The method of claim 1 further including the steps of forming a gate dielectric region over the strained silicon region, and forming a conducting region over said gate dielectric region.

3. The method of claim 2 further including the step of forming a gate stack comprising both said gate dielectric region and said conducting region, which overlaps said relaxed $Si_{1-z}Ge_z$ region between said strained silicon regions.

4. The method according to claim 3 wherein said gate stack comprising said gate dielectric region and conducting region is self-aligned with respect to said spaced apart strained silicon regions.

5. The method according to claim 1 wherein prior to said step of providing a relaxed $Si_{1-z}Ge_z$ epitaxial region performing the step of forming a $Si_{1-x}Ge_x$ epitaxial layer.

6. The method according to claim 5 wherein said $Si_{1-x}Ge_x$ epitaxial region is formed having a germanium profile content selected from the group consisting of a linear graded germanium content x, a step graded germanium content x and a uniform content x.

7. The method according to claim 1 wherein said relaxed $Si_{1-z}Ge_z$ epitaxial region is doped p-type by a process selected from the group consisting of ion implantation followed by annealing and in situ doping.

8. The method according to claim 1 wherein said strained silicon layers are strained with respect to said $Si_{1-z}Ge_z$ layer, and doped n-type by a process selected from the group consisting of ion implantation and in situ doping.

9. The method according to claim 1 wherein said gate dielectric layer is selected from the group consisting of oxide, nitride, oxynitride of silicon, and oxides and silicates of Hf, Al, Zr, La, Y, Ta, singly or in combination.

10. The method according to claim 1 wherein said dielectric regions are selected from the group consisting of an oxide, nitride, oxynitride, and a dielectric material with a permittivity below 4.

11. The method according to claim 2 wherein said conducting region is selected from the group consisting of a metal, metal silicide, a doped poly silicon, or doped poly SiGe.

12. The method according to claim 1 wherein the strained silicon region is auto doped n-type in the area next to the n-type strained silicon regions, and auto doped p-type in the area next to the p-type epitaxial region $Si_{1-z}Ge_z$.

13. The method according to claim 1 wherein the strained silicon layer is grown after a chemical mechanical polishing (CMP) of the upper surface of said relaxed p-type $Si_{1-z}Ge_z$ epitaxial region.

14. A field effect transistor comprising:

a substrate having a body comprising a relaxed $Si_{1-z}Ge_z$ epitaxial region doped p-type, spaced apart source/drain regions comprising strained silicon regions located within an upper portion of said relaxed $Si_{1-z}Ge_z$ region, said strained silicon regions doped n-type to a concentration level greater than $1 \times 10^{19}$ atoms/cm$^3$ and providing a vertical and lateral heterojunction between the source/drain regions and the body whereby said vertical heterojunction is contained entirely in said body, a strained silicon region over said relaxed $Si_{1-z}Ge_z$ region and said strained silicon regions, a gate dielectric region over said strained silicon region, and a conducting region over said gate dielectric region.

15. The field effect transistor according to claim 14 further including a gate stack comprising both said gate dielectric region and said conducting region, which overlaps said relaxed $Si_{1-z}Ge_z$ region between said strained silicon regions.

16. The field effect transistor according to claim 15 wherein said gate stack comprising said gate dielectric region and conducting region is self-aligned with respect to said spaced apart strained silicon regions.

17. The field effect transistor according to claim 15 wherein said conducting region is selected from the group consisting of a metal, metal silicide, a doped poly silicon, or doped poly SiGe.

18. The field effect transistor according to claim 14 further including a $Si_{1-x}Ge_x$ epitaxial layer below said relaxed $Si_{1-z}Ge_z$ region.

19. The field effect transistor according to claim 18 wherein said $Si_{1-x}Ge_x$ epitaxial region has a germanium profile content selected from the group consisting of a linear graded germanium content x, a step graded germanium content x and a uniform content x.

20. The field effect transistor according to claim 14 wherein said gate dielectric layer is selected from the group consisting of oxide, nitride, oxynitride of silicon, and oxides and silicates of Hf, Al, Zr, La, Y, Ta, singly or in combination.

21. The field effect transistor according to claim 14 wherein said dielectric regions are selected from the group consisting of an oxide, nitride, oxynitride, and a dielectric material with a permittivity below 4.

22. The field effect transistor according to claim 14 wherein the strained silicon region is doped n-type in the area next to the n-type strained silicon regions, and doped p-type in the area next to the p-type epitaxial region $Si_{1-z}Ge_z$.

23. The field effect transistor according to claim 14 wherein said strained silicon layer is grown on a chemical mechanical polished (CMP) upper surface of said relaxed $Si_{1-z}Ge_z$ epitaxial region.

* * * * *